(12) United States Patent
Kuwabara et al.

(10) Patent No.: US 8,482,931 B2
(45) Date of Patent: Jul. 9, 2013

(54) PACKAGE STRUCTURE

(75) Inventors: Ryo Kuwabara, Osaka (JP); Koso Matsuno, Osaka (JP); Atsushi Yamaguchi, Osaka (JP); Hidenori Miyakawa, Osaka (JP)

(73) Assignee: Panasonic Corporation, Osaka (JP)

( * ) Notice: Subject to any disclaimer, the term of this patent is extended or adjusted under 35 U.S.C. 154(b) by 430 days.

(21) Appl. No.: 12/632,270

(22) Filed: Dec. 7, 2009

(65) Prior Publication Data

US 2010/0159719 A1    Jun. 24, 2010

(30) Foreign Application Priority Data

Dec. 24, 2008 (JP) ................... 2008-327323

(51) Int. Cl.
*H05K 7/12* (2006.01)
*H05K 1/14* (2006.01)

(52) U.S. Cl.
CPC ..................................... *H05K 1/144* (2013.01)
USPC .......................................... 361/770; 174/256

(58) Field of Classification Search
CPC ................................................... H05K 1/144
USPC ................ 361/770, 784, 760; 174/250–266; 257/777, 686; 428/413
See application file for complete search history.

(56) References Cited

U.S. PATENT DOCUMENTS

| | | | | |
|---|---|---|---|---|
| 5,825,630 A | * | 10/1998 | Taylor et al. | 361/790 |
| 6,791,178 B2 | * | 9/2004 | Yamaguchi et al. | 257/699 |
| 7,133,295 B2 | * | 11/2006 | Lee | 361/785 |
| 7,394,148 B2 | * | 7/2008 | Karnezos | 257/686 |
| 2004/0212096 A1 | * | 10/2004 | Wang | 257/777 |
| 2006/0154078 A1 | * | 7/2006 | Watanabe et al. | 428/413 |

FOREIGN PATENT DOCUMENTS

| | | | |
|---|---|---|---|
| JP | 11-307973 | | 11/1999 |
| JP | 2005-286181 | | 10/2005 |
| JP | 2005286181 | * | 10/2005 |
| JP | 2006-049381 | | 2/2006 |

\* cited by examiner

*Primary Examiner* — Yuriy Semenenko
(74) *Attorney, Agent, or Firm* — McDermott Will & Emery LLP

(57) ABSTRACT

A package structure includes a first printed wiring board having mounted on a top surface a plurality of electronic components including at least one first electronic component, a second printed wiring board stacked on the top surface side of the first printed wiring board, and a plurality of connecting members for mechanically connecting the first and second printed wiring boards while maintaining a constant gap therebetween, the connecting members including a first cured resin for bonding a top surface of the at least one first electronic component to a bottom surface of the second printed wiring board.

17 Claims, 5 Drawing Sheets

PACKAGE STRUCTURE

FIELD OF THE INVENTION

The present invention relates to package structures formed by stacked boards. More specifically, the present invention relates to improvements to integrated electronic device structures in which a plurality of printed wiring boards each having mounted thereon one or more electronic components, such as semiconductor devices, are stacked with a predetermined gap.

BACKGROUND OF THE INVENTION

In recent years, there has been an increasing trend in the field of electronic and electrical devices, for example, toward enhanced performance and reduced size and thickness. Correspondingly, for semiconductor devices provided in electronic and electrical devices for mainly controlling their operations, there is a strong need for such semiconductor devices to be reduced in thickness and also to be formed for dense packaging on printed wiring boards. To satisfy such a need, electronic components, such as chip parts and CSP (chip size package) type semiconductor elements, are being further reduced in size and enhanced in performance. Also, for the printed wiring boards, wiring patterns are being further miniaturized, for example, by reducing wiring widths and pitches between wiring conductors, thereby making it possible to package electronic components on printed wiring boards with higher density.

To achieve denser packaging, some electronic devices employ a recently developed structure in which a plurality of printed wiring boards are stacked and electrically connected via a connector provided therebetween. Specifically, two printed wiring boards to be stacked together have a pair of connectors attached at the centers of their corresponding principal surfaces, and the connectors are coupled so that the printed wiring boards are stacked in the vertical direction of the principal surfaces. In such a stacked structure, most of the load vertically applied to the principal surfaces of the printed wiring boards concentrates at the joint between the connectors, so that stress is caused at the joint. As a result, electrical connections within the connectors might be broken. When further excessive stress is caused, the connectors themselves might be broken. Also, when load is locally applied to an end portion of the stacked printed wiring boards, the gap between the boards is narrowed on the side under load, so that the printed wiring boards or electronic components might be brought into mutual contact. In the worst case, the printed wiring boards or electronic components could be broken. Moreover, even when the applied load is relatively low, if the printed wiring boards are repeatedly subjected to such a load, the boards might be deformed so that connections between the components and the boards are broken.

On the other hand, thermosetting resin compositions are widely used for packaging leadless- or chip-type electronic components on printed wiring boards. For example, a thermosetting resin composition is applied to a predetermined position on the surface of the printed wiring board through selective printing, and electronic components are mounted and attached onto the applied composition before the composition is cured by heating to temporarily joint the electronic components to the printed wiring board. Then, the printed wiring board is fluxed and dipped in molten solder, thereby electrically connecting and fixing the electronic components to the wiring of the printed wiring board. In this manner, the electronic components are completely packaged on the printed wiring board.

However, in recent years, the thermosetting resin composition has come into use for other applications in addition to those as described above, including bonding and fixing electronic components to the surface of the printed wiring board. For example, Japanese Laid-Open Patent Publication No. 2006-049381 proposes a device in which a thermosetting insulating adhesive is applied between a shield case and electronic components packaged on a printed wiring board in order to prevent contact therebetween.

Japanese Laid-Open Patent Publication No. Hei 11-307973 proposes a voltage-controlled oscillator including a printed wiring board, a main voltage-controlled oscillator unit provided with an oscillation coil, and a shield case, in which the oscillation coil is fixed to the shield case via an adhesive, thereby preventing the voltage-controlled oscillator from causing howling. While the adhesive is described as a thermosetting resin composition, the thermosetting resin composition is intended solely for fixing the oscillation coil to the shield case.

Japanese Laid-Open Patent Publication No. 2005-286181 discloses an electronic device including a printed wiring board and a module board attached thereto, in which electrical contacts between the printed wiring board and the module board are elastic connectors. Illustrated examples of the connectors include metallic helical springs and conductive rubbers.

Also, Japanese Laid-Open Patent Publication No. 2005-286181 proposes a device in which a module board is jointed to a printed wiring board by providing an adhesive layer between the module board and electronic components packaged on the printed wiring board. While the adhesive contains thermoplastic resin, the layer is not thick enough to allow sufficiently wide dispersion of stress caused by load externally applied thereto. Accordingly, in the case of the structure described in this publication, as in the aforementioned stacked structure employing connectors, external stress mainly concentrates at electronic components, which might lead to, for example, deformation, breakage, or loss of the electronic components, resulting in poor connections between the printed wiring board and the module board.

BRIEF SUMMARY OF THE INVENTION

An object of the present invention is to provide a package structure formed by stacking a plurality of printed wiring boards with a predetermined gap and having a sufficient mechanical strength to make the structure resistant to deformation, breakage, etc., and thereby to maintain an approximately constant gap between the printed wiring boards even when external stress is applied thereto. One aspect of the invention is directed to a package structure having at least two printed wiring boards stacked together, in which at least one of a plurality of connecting members for mechanically connecting the printed wiring boards while maintaining a predetermined gap between them is a cured resin for bonding the top surface of an electronic component mounted on one printed wiring board to the bottom surface of the other printed wiring board.

Another aspect of the invention is directed to a package structure having at least two printed wiring boards stacked together, in which at least one of a plurality of connecting members for mechanically connecting the printed wiring boards while maintaining a predetermined gap between them is a cured resin for bonding the top surface of an electronic component mounted on one printed wiring board to the top surface of an electronic component mounted on the other printed wiring board.

In the present invention, cured resins for directly bonding two printed wiring boards can be used as connecting members.

The present invention makes it possible to efficiently achieve a compact structure formed in particular by stacking printed wiring boards having electronic components densely packaged thereon. Also, cured resins are used as connecting members, and therefore two printed wiring board can be mechanically connected in a secure manner, thereby increasing the strength of the stacked structure formed by the printed wiring boards.

Still another aspect of the invention is directed to a portable storage device including the aforementioned package structure.

While the novel features of the invention are set forth particularly in the appended claims, the invention, both as to organization and content, will be better understood and appreciated, along with other objects and features thereof, from the following detailed description taken in conjunction with the drawings.

DETAILED DESCRIPTION OF THE INVENTION

Figure 1:
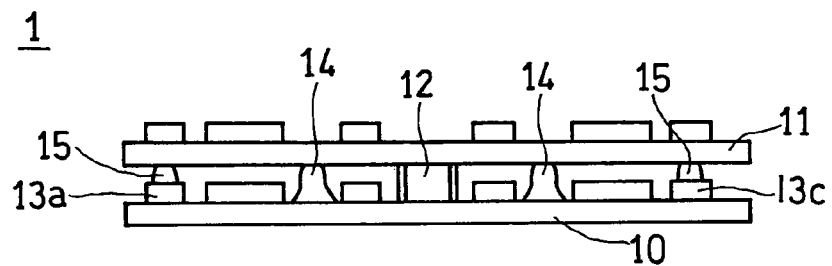
FIG. 1 is a side view schematically illustrating the structure of an electronic device according to one embodiment of the present invention.

In one aspect of the present invention, a package structure includes a first printed wiring board having mounted on a top surface a plurality of electronic components including at least one first electronic component, a second printed wiring board stacked on the top surface side of the first printed wiring board, and a plurality of connecting members for mechanically connecting the first and second printed wiring boards while maintaining a constant gap therebetween, the connecting members including a first cured resin for bonding a top surface of the at least one first electronic component to a bottom surface of the second printed wiring board.

In a preferred embodiment of the invention, the connecting members include a second cured resin for directly bonding the top surface of the first printed wiring board to the bottom surface of the second printed wiring board.

In another preferred embodiment of the invention, the electronic components include at least one second electronic component, the second printed wiring board has at least one third electronic component mounted thereon at a position corresponding to the at least one second electronic component, and the connecting members include a third cured resin for bonding a top surface of the at least one second electronic component to a top surface of the at least one third electronic component.

It is preferable to further include a connector provided at an approximate center of the first printed wiring board for mechanically and electrically connecting the first and second printed wiring boards.

It is preferable that the number of cured resins used as the connecting members (i.e., in the case where only the first cured resins are used, the number of first cured resins, or in the case where the first and second cured resins or the first, second, and third cured resins are used, their total number) be at least four, and the cured resins be positioned approximately left-right symmetric about the connector.

In another aspect of the present invention, a package structure includes a first printed wiring board having mounted on a top surface a plurality of electronic components including at least one first electronic component, a second printed wiring board having mounted on a bottom surface a plurality of electronic components including at least one second electronic component, and a plurality of connecting members for mechanically connecting the first and second printed wiring boards while maintaining a constant gap therebetween, the connecting members including a first cured resin for bonding a top surface of the at least one first electronic component to a top surface of the at least one second electronic component.

It is preferable that the connecting members include a second cured resin for directly bonding the top surface of the first printed wiring board to the bottom surface of the second printed wiring board.

Furthermore, it is preferable to further include a connector provided at an approximate center of the first printed wiring board for mechanically and electrically connecting the first and second printed wiring boards.

Also, the electronic components are preferably semiconductor elements in flat package format.

The present invention makes it possible to efficiently achieve a compact structure formed in particular by stacking printed wiring boards having electronic components densely packaged thereon. Also, cured resins are used as connecting members, and therefore two printed wiring board can be mechanically connected in a secure manner, thereby increasing the strength of the stacked structure formed by the printed wiring boards. Specifically, stress caused by load externally applied to the stacked structure is dispersed across the entire structure in an approximately uniform manner. Also, the gap between the printed wiring boards can be maintained approximately constant. Accordingly, for example, deformation, such as warpage, and breakage of the printed wiring board and the module board can be significantly reduced, along with breakage, loss, etc., of the connector and other electronic components. Thus, it is possible to achieve a device with increased service life capable of properly operating even under external load.

Devices structured in accordance with the present invention are very useful in producing electronic and electrical devices which require printed wiring boards to be three-dimensionally stacked and arranged within an extremely small space. Especially, such devices are particularly useful in the fields of portable large-capacity storage devices, such as memory cards, and portable electronic devices, such as cell phones and notebook computers. In these fields, high-density packaging and high durability will become increasingly necessary. Thus, increasing the strength of the stacked structure according to the present invention produces significant effects on the security and reliability of electrical and electronic devices.

Embodiment 1

Figure 4:
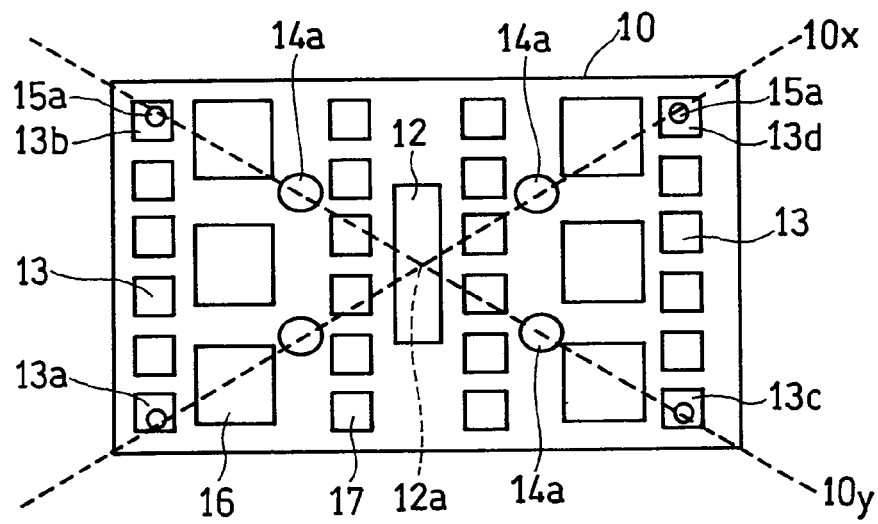
FIG. 4 is a top view illustrating the state of the top surface of a printed wiring board after the step shown in FIG. 3.

An electronic device includes a printed wiring board 10 acting as a so-called motherboard, to which are attached a module board 11 acting as a daughterboard, a connector 12, electronic components 13 in flat package format, cured resins 14, and cured resins 15, as shown in FIGS. 1 and 4. The connector 12 can be a set of male and female connectors which are widely and readily available commercial products. One of the connectors is mounted in a predetermined position on the printed wiring board 10, and the other connector is mounted in a corresponding position on the module board 11 opposed to the printed wiring board 10. As will be described later, these two connectors are connected when stacking the printed wiring board 10 and the module board 11 together. As a result, the printed wiring board 10 and the module board 11 are connected together mechanically and electrically.

The printed wiring board 10 has a predetermined wiring pattern formed thereon, and also has the connector 12, the electronic components 13, and other electronic components mounted thereon. Note that no wiring is shown in the aforementioned figures and other figures to be mentioned below. Similarly, the module board 11 has a predetermined wiring pattern formed thereon, and also has mounted thereon a plurality of types of electronic components, each type including one or more components. In the case of the device 1, boards of the same size are used as the printed wiring board 10 and the module board 11. More specifically, the size is 40 mm wide, 50 mm long, and 0.5 mm thick. The printed wiring board 10 and the module board 11 may be equal in, for example, size, including thickness, wiring arrangement, and the type of electronic components mounted thereon, or they may be different in terms of any one of the above.

The connector 12 is mounted on an area including the center of the printed wiring board 10. The center of the printed wiring board 10 is the intersection of two diagonal lines $10x$ and $10y$ of the printed wiring board 10 shown in FIG. 4. While FIG. 4 illustrates an example where the planar shape of the connector 12, i.e., the shape projected onto the principal surface of the printed wiring board, is approximately rectangular, the projected shape is not limited to this and may be any shape, such as a trapezoid, a circle, or an ellipse. In the case where the projected shape of the connector 12 is rectangular, the center $12a$ of the connector 12 is the intersection of two diagonal lines of the rectangle. In the case where the projected shape of the connector 12 is trapezoidal or elliptical, the center $12a$ of the connector 12 is the intersection of two diagonal lines of the smallest rectangle inscribed in the trapezoid or ellipse. In the case where the projected shape of the connector 12 is circular, the center $12a$ coincides with the center of the circle.

In the electronic device 1, the connector 12 has an approximately rectangular projected shape, and therefore is mounted on the printed wiring board 10 such that its center coincides with the center of the printed wiring board 10. Here, the central coincidence is intended to mean that two centers are present on one virtual line extending in the direction perpendicular to the principal surface of the printed wiring board 10. The connector 12 allows mechanical coupling and electrical connection between the printed wiring board 10 and the module board 11.

The electronic components 13 are mounted in areas along sides perpendicular to the longitudinal direction of the printed wiring board 10. Specifically, in an area along one side perpendicular to the longitudinal direction of the printed wiring board 10, one group of electronic components are arranged at approximately regular intervals in the width direction of the printed wiring board 10 such that the electronic components 13 are approximately parallel to that side. In an area along the other side perpendicular to the longitudinal direction of the printed wiring board 10, the other group of electronic components are arranged at approximately regular intervals in the width direction of the printed wiring board 10 such that the electronic components 13 are approximately parallel to that side. In this manner, mounting a plurality of electronic component groups on the printed wiring board 10 makes it possible to readily position the cured resins 15.

The cured resins 14 are disposed between the printed wiring board 10 and the module board 11, as shown in FIGS. 1 and 4, to directly and firmly bond the boards. In the present embodiment, there are provided four cured resins 14, which are paired such that the resins in each pair are positioned point-symmetric with respect to the center $12a$ of the connector 12.

The four cured resins 14 are positioned on either the diagonal line $10x$ or $10y$ of the printed wiring board 10 at approximately the same distance from the center of the printed wiring board 10, as shown in FIG. 4. While it is preferable that the cured resins 14 be positioned point-symmetric with respect to the center $12a$, they are not necessarily disposed on either the diagonal line $10x$ or $10y$ of the printed wiring board 10.

Also, the cured resins 14 are disposed such that two of them are positioned between two electronic component groups on each of two longitudinal sides of the printed wiring board 10. One electronic component group consists of several relatively small-sized electronic components 17, which are arranged in the vicinity of the connector 12 across the width of the printed wiring board 10. The other electronic component group consists of three relatively large-sized electronic components 16, which are arranged in the vicinity of the electronic component group consisting of the electronic components 13 across the width of the printed wiring board 10. In this manner, the cured resins 14 for directly bonding the printed wiring board 10 and the module board 11 are disposed between two types of electronic component groups, thereby improving the effect of reinforcing the stacked structure.

The cured resins 15 are disposed between the electronic components $13a$, $13b$, $13c$, and $13d$ and the module board 11, as shown in FIGS. 1 and 4, to bond the electronic components $13a$, $13b$, $13c$ and $13d$ to the module board 11. These cured resins maintain a predetermined gap between the printed wiring board 10 and the module board 11. In the electronic device 1, there are provided four cured resins 15, which are paired such that the resins in each pair are positioned point-symmetric with respect to the center $12a$ of the connector 12.

Also, the four cured resins 15 are positioned on either the diagonal line 10x or 10y of the printed wiring board 10 at approximately the same distance from the center of the printed wiring board 10, as shown in FIG. 4. The cured resins 15 are characterized in particular by being provided on electronic components. In general, electronic components mounted on the printed wiring board are prevented from being subjected to external force. However, in this example, electronic components are intentionally used to connect the printed wiring board and the module board, thereby saving space. In particular, electronic components in flat package format can be stably connected to boards, and therefore it is advantageous to use their top surfaces for connection with another board.

As described above, the four cured resins 14 and the four cured resins 15 are positioned point-symmetric with respect the center 12a of the connector 12. Specifically, there are two cured resins 14 and two cured resins 15, one each on the diagonal lines 10x and 10y on one and the other side of the connector 12 in the longitudinal direction of the printed wiring board 10. The "one side of the connector 12" refers to an area between the connector 12 and one end in the longitudinal direction of the printed wiring board 10. The "other side of the connector 12" refers to an area between the connector 12 and the other end in the longitudinal direction of the printed wiring board 10.

This configuration enhances mechanical strength of the stacked structure formed by the printed wiring board 10 and the module board 11. Specifically, stress caused by load externally applied to the structure is dispersed across the entire structure in an approximately uniform manner. As a result, the stress is prevented from concentrating solely at the connector 12. Also, the gap between the printed wiring board 10 and the module board 11 is held approximately the same in any part of the stacked structure. Thus, the connector 12, the electronic components 13, and other electronic components are prevented from being broken or deformed, which makes it possible to remarkably improve long-term reliability of the electronic device 1.

The electronic device 1 has eight cured resins in total, but this is not restrictive, and any number of cured resins may be formed so long as the number is two or more. Given the stacked structure reinforcement effect of the cured resins and workability during cured resin formation, the number of cured resins is preferably four to ten, more preferably six to eight. Furthermore, the cured resins are preferably formed in areas within a distance of 10 mm from four corners of the printed wiring board 10. The areas in which to form the cured resins can be suitably changed in accordance with the size of the printed wiring board 10 or the module board 11.

The cured resins 14 and 15 are preferably thermosetting resin compositions cured by heating or irradiation with ultraviolet. It is preferable that the thermosetting resin composition for use in forming the cured resins 14 be highly adherent to the printed wiring board 10 and the module board 11. Also, it is preferable that the thermosetting resin composition for use in forming the cured resins 15 be highly adherent to the printed wiring board 10 or the module board 11, and to the electronic components 13.

For example, the thermosetting resin compositions contain a thermosetting resin and a filler. Examples of the thermosetting resin include epoxy resin, silicone resin, and polyurethane. Rubbers, such as butyl rubber, may also be used in place of the thermosetting resin. Of all these, epoxy resin is preferable. The filler is used for adjusting the viscosity of the thermosetting resin composition, enhancing post-curing mechanical strength, and so on. An inorganic powder filler or a metallic powder filler is particularly preferable.

The inorganic powder filler and the metallic powder filler are not limited to any specific type, and can be of any type typically used in the field of semiconductor devices. Examples include aluminum powder, alumina, activated alumina, aluminum hydroxide, activated charcoal, carbon black, silica sand, titanium oxide, magnesium oxide, magnesium hydroxide, baking soda (sodium bicarbonate), hydrated lime (calcium hydroxide), gypsum (calcium sulfate), silica, talc, and mica. These fillers can be used alone or in combination with another filler.

The thermosetting resin compositions may contain a typical additive in addition to the thermosetting resin and the filler. Examples of the additive include a curing agent and a curing accelerator for the thermosetting resin, a coupling agent, a coloring agent, a flame retardant, a release agent, an ion scavenger, and an anti-oxidizing agent. Examples of the coupling agent include a silane coupling agent, a titanate coupling agent, an aluminum coupling agent, and an aluminum/zirconium coupling agent. Examples of the coloring agent include carbon black and colcothar. Examples of the flame retardant include brominated epoxy resin, antimony oxide, aluminum hydroxide, magnesium hydroxide, zinc oxide, and a phosphorous-containing compound.

Examples of the release agent include natural waxes, such as carnauba wax, synthetic waxes, such as polyethylene wax, higher fatty acids, such as stearic acid and zinc stearate, metal salts of higher fatty acid, and paraffin. Examples of the ion scavenger include a magnesium scavenger, an aluminum scavenger, a titanium scavenger, and a bismuth scavenger.

These additives can be used alone or in combination with another additive.

The thermosetting resin compositions can be produced by mixing, for example, thermosetting resin pellets and a filler, and optionally any of various additives.

In the present embodiment, thermosetting resin composition A for use in forming the cured resins 14 (hereinafter, simply referred to as "composition A") and thermosetting resin composition B for use in forming the cured resins 15 (hereinafter, simply referred to as "composition B") are different compositions with different viscosities. The viscosity of composition A is preferably set to be higher than that of composition B. The viscosities of compositions A and B can be adjusted, for example, by suitably selecting the type of the thermosetting resin and the filler content. In this manner, the cured resins 14 and the cured resins 15 are formed using thermosetting resin compositions with different viscosities, thereby further enhancing the effect of reinforcing the stacked structure by the cured resins 14 and 15. Correspondingly, the work efficiency in electronic device production is remarkably enhanced.

Preferably, composition A has a viscosity of 70 to 90 Pa·s and a thixotropic index of 6 to 8 at a temperature of 25° C. The viscosity is obtained using a cone-plate viscometer ("RE550U" available from Toki Sangyo Co., Ltd.). The thixotropic index is a viscosity ratio $P_1/P_2$ at a temperature of 25° C. where $P_1$ is a viscosity with the cone plate rotating at a speed of 0.5 rpm and $P_2$ is a viscosity with the cone plate rotating at a speed of 5 rpm. The viscosity and the thixotropic index of composition B to be described below are also measured in a similar manner.

Composition A is applied to the surface of the printed wiring board 10 through a nozzle connected to a reservoir for composition A during the electronic device production process to be described later. The cured resins 14 obtained by curing composition A must be brought into contact with both the printed wiring board 10 and the module board 11. Accordingly, the top of composition A applied to the printed wiring board 10 is required to be higher than those of the connector 12, the electronic components 13, and other electronic components on the surface of the printed wiring board 10.

When composition A has a viscosity of less than 70 Pa·s or a thixotropic index of less than 6, the contact between the cured resins 14 and the module board 11 is insufficient, which might result in reduced reinforcement effect of the cured resins 14. On the other hand, when composition A has a viscosity of more than 90 Pa·s or a thixotropic index of more than 8, the nozzle of the application device might be clogged, so that composition A cannot be stably applied to the surface of the printed wiring board 10 through the nozzle.

Composition B preferably has a viscosity of 40 to 70 Pa·s and a thixotropic index of 4 to 5 at a temperature of 25° C. As with composition A, composition B is applied to the surfaces of the electronic components 13 through a nozzle during the electronic device production process to be described later. On the other hand, the gaps between the module board 11 and the electronic components 13 are narrower than the gap between the printed wiring board 10 and the module board 11. Accordingly, in order to enhance the bonding strength between the module board 11 and the electronic components 13 through increased bonding areas, it is preferable that composition B readily be spread to some extent on the surfaces of the electronic components 13.

When composition B has a viscosity of less than 40 Pa·s or a thixotropic index of less than 4, composition B might be spattered during application to the surfaces of the electronic components 13 through the nozzle, resulting in uneven application. When composition B has a viscosity of more than 70 Pa·s or a thixotropic index of more than 5, composition B might be difficult to be spread on the surfaces of the electronic components 13. In either case, the bonding strength between the module board 11 and the electronic components 13 might be reduced.

The difference in glass-transition temperature of compositions A and B from the printed wiring board 10 and the module board 11 (hereinafter, simply referred to as the "glass-transition temperature difference") is preferably 15° C. or less, more preferably 10° C. or less. Compositions A and B are respectively applied to the surface of the printed wiring board 10 and the surfaces of the electronic components 13 through the nozzles, and cured by heating, for example. In this case, the printed wiring board 10 and the module board 11 are also hardened by heating. The following advantage is obtained when the glass-transition temperature difference is 15° C. or less.

The differences are small i) between compositions A and B and the printed wiring board 10 and ii) between compositions A and B and the module board 11 in terms of the time at which they start to be hardened when the temperature falls after a predetermined time of heating. As a result, internal structures of the cured resins 14 and 15 are rendered approximately uniform, so that their reinforcement effects are enhanced. When the glass-transition temperature difference is more than 15° C., the differences are large i) between compositions A and B and the printed wiring board 10 and ii) between compositions A and B and the module board 11 in terms of the time at which they start to be hardened. As a result, the cured resin structures contract in one direction, so that the reinforcement effects of the cured resins 14 and 15 are reduced.

Also, the difference in linear expansion coefficient between compositions A and B from the printed wiring board 10 and the module board 11 (hereinafter, simply referred to as the "linear expansion coefficient difference") is preferably $1.0 \times 10^{-5}$ or less, more preferably $5.0 \times 10^{-6}$ or less. When the linear expansion coefficient difference is $1.0 \times 10^{-5}$ or less, the differences are small i) between compositions A and B and the printed wiring board 10 and ii) between compositions A and B and the module board 11 in terms of the degree of contraction when they are hardened. As a result, the printed wiring board 10 and the module board 11 can be prevented from deforming, e.g., warping. When the linear expansion coefficient difference is more than $1.0 \times 10^{-5}$, the printed wiring board 10 and the module board 11 are susceptible to deformation such as warpage.

Furthermore, the curing temperature of compositions A and B is preferably 85 to 100° C. When the curing temperature is less than 85° C., it takes a long period of time to cure compositions A and B, which might result in reduced workability during the process of producing the electronic device 1. When the curing temperature is more than 100° C., the printed wiring board 10 and the module board 11 might be deformed, e.g., warped.

Figure 2:
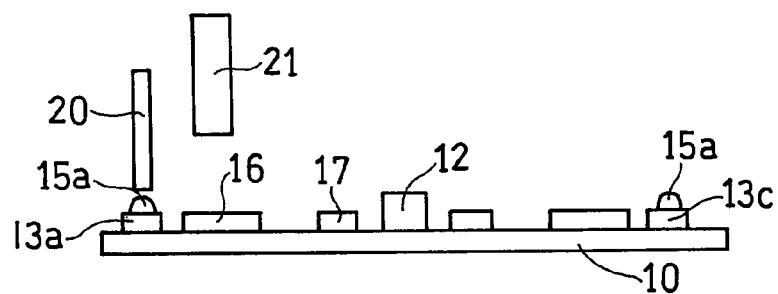
FIG. 2 is a side view illustrating one step (the step for forming cured resins 15) of the production process for the electronic device shown in FIG. 1.
Figure 3:
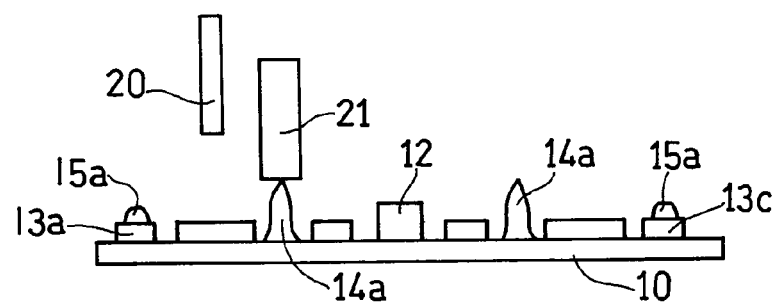
FIG. 3 is a side view illustrating one step (the step for forming third cured resins 14) of the production process for the electronic device shown in FIG. 1.

The cured resins 14 and 15 can be formed, for example, by a method including the steps as shown in FIGS. 2, 3, and 4. In the step shown in FIG. 2, first, a connector 12, electronic components 13, and other electronic components are mounted on a printed wiring board 10. Also, a plurality of electronic components are mounted on a module board 11 as well. Then, composition B is dropped through an application nozzle 20 onto the surfaces of the electronic components 13a, 13b, 13c, and 13d mounted on the printed wiring board 10, thereby forming four applied drops 15a. The applied drops 15a are formed in pairs such that two drops in each pair are positioned point-symmetric with respect to the center 12a of the connector 12.

The application nozzle 20 is disposed vertically above the printed wiring board 10 such that the drop direction of composition B is perpendicular or approximately perpendicular to the surfaces of the electronic components 13. The application nozzle 20 is supported by a supporting means (not shown) so as to be vertically movable up and down and also movable forward, backward, leftward, and rightward within a horizontal plane. The application nozzle 20 is controlled to approach the surface of the electronic component 13 when dropping composition B, and move away therefrom when not dropping composition B.

In the step shown in FIG. 3, composition A is dropped through an application nozzle 21 onto the surface of the printed wiring board 10, thereby forming four applied drops 14a. The applied drops 14a are formed in pairs such that two drops in each pair are positioned point-symmetric with respect to the center 12a of the connector 12. Also, the four applied drops 14a are positioned closer to the center 12a of the connector 12 than are the four applied drops 15a. As a result, the state shown in FIG. 4 is obtained.

As with the application nozzle 20, the application nozzle 21 is disposed vertically above the printed wiring board 10 such that the drop direction of composition A is perpendicular or approximately perpendicular to the surface of the printed wiring board 10. The application nozzle 21 is supported by a supporting means (not shown) so as to be vertically movable up and down and also movable forward, backward, leftward, and rightward within a horizontal plane. The application nozzle 21 is controlled to approach the surface of the printed wiring board 10 when dropping composition A, and move away therefrom when not dropping composition A.

The application diameter and height for the applied drops 14a and 15a are suitably selected in accordance with the height of the cured resins 14 and 15 to be obtained and the sizes of regions where they are applied. The gap between the printed wiring board 10 and the module board 11 is typically 3 mm or less, and for example, when the height of the cured resins is 1.0 mm or more, it is preferable that the application diameter of the applied drops 14a and 15a be 0.8 mm or more, and the application height be 2.0 mm or more. When the height of the cured resins is less than 1.0 mm, it is preferable that the application diameter of the applied drops 14a and 15a be 0.6 mm or more, and the application height be 1.5 mm or more. The application diameter and height can be adjusted, for example, by suitably selecting the amounts of application, ingredients and viscosities of compositions A and B, as well as the drop heights of the nozzles 20 and 21.

Thus, the cured resins 14 and 15, which are obtained by curing the applied drops 14a and 15a, can reliably bond the printed wiring board 10 to the module board 11, and the electronic components 13 to the module board 11. As a result, external stress can be further uniformly dispersed in the stacked structure, making it possible to significantly enhance mechanical strength, service life, etc., of the electronic device 1.

Particularly, cured resins for connecting electronic components and printed wiring boards are advantageous. This is because available space is extremely limited on printed wiring boards, which makes it difficult to directly connect the printed wiring boards. The electronic components to be connected by such resins are suitably semiconductor elements or chips in flat package format with flat tops. This is because the electronic components, when mounted on the printed wiring board, have flat top surfaces parallel to the surface of the printed wiring board, and the top surfaces are relatively large in area and hence large in junction area for the printed wiring board to be joined.

In the step shown in FIG. 4, the module board 11 is stacked on the printed wiring board 10 at a predetermined pitch such that at least the tips of the applied drops 14a and 15a are brought into contact with the bottom surface of the module board 11. While maintaining this state, the applied drops 14a and 15a are cured to obtain the electronic device 1. The applied drops 14a and 15a can be cured using a typical method for curing thermosetting resin compositions. An example of the method is heating or ultraviolet irradiation. In the case of heating, for example, the entire stacked structure formed by the printed wiring board 10 and the module board 11 may be heated.

While the foregoing has been described with respect to an example where the connector 12 is mounted, the same applies to the case where the connector 12 is not mounted.

Embodiment 2

Figure 5A:
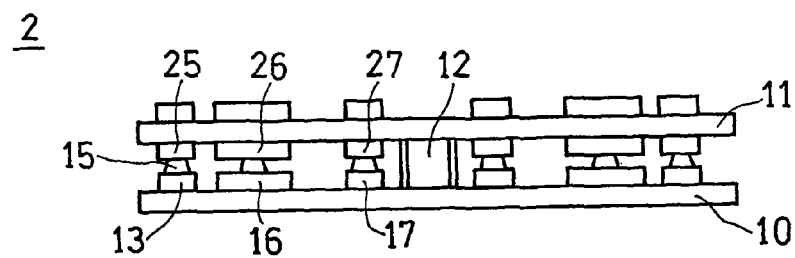
FIG. 5A is a side view schematically illustrating the structure of an electronic device according to another embodiment of the present invention.
Figure 5B:
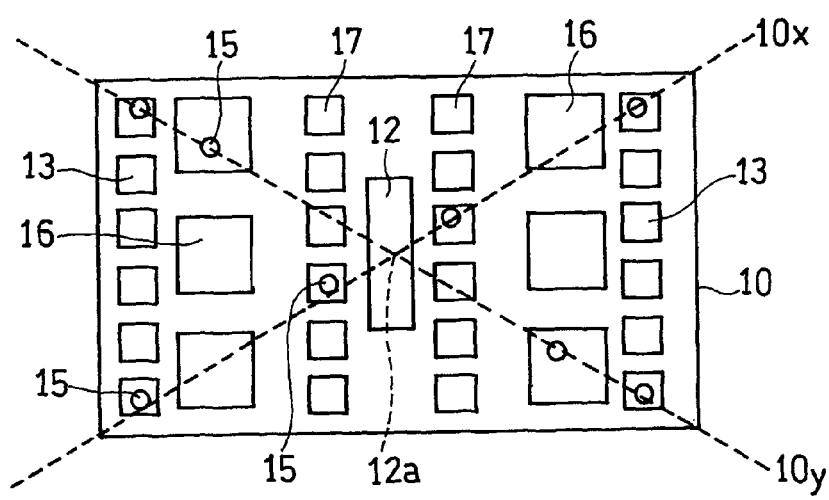
FIG. 5B is a top view of a printed wiring board shown in FIG. 5A.

FIG. 5A is a side view of an electronic device 2 according to the present embodiment, and FIG. 5B is a top view of a printed wiring board included therein. The electronic device 2 is similar to the electronic device 1, corresponding elements are denoted by the same reference characters, and any descriptions thereof will be omitted.

The electronic device 2 includes a printed wiring board 10, a module board 11, electronic components 13, 16, and 17, electronic components 25, 26, and 27, and cured resins 15. The cured resins 15 are formed using thermosetting resin composition B as described earlier. In the electronic device 2, the cured resins 15 respectively bond the electronic components 13, 16, and 17 on the printed wiring board 10 to the electronic components 25, 26, and 27 on the module board 11. Thus, a stacked structure is formed by the printed wiring board 10 and the module board 11. Specifically, the electronic device 2 does not include any cured resins 14 for bonding the printed wiring board 10 and the module board 11 together, and the stacked structure is formed through mechanical connections only by the cured resins 15.

The printed wiring board 10 has mounted thereon the connector 12 and the electronic components 13, 16, and 17. The electronic components 13 are the same in position and number as those mounted within the electronic device 1. The electronic components 17 are mounted in areas opposing with respect to the connector 12 and positioned perpendicular to the longitudinal direction of the printed wiring board 10, such that each area includes a plurality of electronic components 17 forming a line in the width direction of the printed wiring board 10. The electronic components 17 are approximately the same in size as the electronic components 13. The electronic components 16 are mounted in areas between the electronic components 13 and 17 and positioned perpendicular to the longitudinal direction of the printed wiring board 10, such that each area includes a plurality of electronic components 16 forming a line in the width direction of the printed wiring board 10. The electronic components 16 are larger than the electronic components 13 and 17.

The module board 11 has a plurality of electronic components mounted on two parallel surfaces, one facing the printed wiring board 10, the other being opposite thereto. The surface of the module board 11 that faces the printed wiring board 10 has each of the electronic components 25, 26, and 27 mounted in plurality. The electronic components 25, 26, and 27 are mounted with their top surfaces respectively facing the top surfaces of the electronic components 13, 16, and 17 mounted on the printed wiring board 10.

The cured resins 15 are provided in eight places. The cured resins 15 are provided in areas at opposite ends of the longitudinal direction of the printed wiring board 10, such that each area includes four cured resins 15 in two pairs each being positioned point-symmetric to a corresponding pair in the other area with respect to the center 12a of the connector 12. Also, the cured resins 15 are provided on either a diagonal line 10x or 10y of the printed wiring board 10. Four of the eight cured resins 15 are disposed between the electronic components 13 and 25 mounted at four corners of the printed wiring board 10. Another two cured resins 15 are disposed between the electronic components 16 and 26, and the remaining two are disposed between the electronic components 17 and 27.

In the electronic device 2, the cured resins 15 are positioned point-symmetric with respect to the center 12a of the connector 12, and the distance between the center 12a and the cured resin 15 to the center 12a varies from one pair to the other. As a result, it is possible to increase durability to resist stress being applied which could otherwise torsionally deform the stacked structure formed by the printed wiring board 10 and the module board 11. Particularly, this example is characterized in that upper and lower electronic components are connected by cured resins, which makes it possible to prevent the upper and lower electronic components from being broken by hitting against each other and also possible to save space by not providing any additional space for connections.

Embodiment 3

Figure 6A:
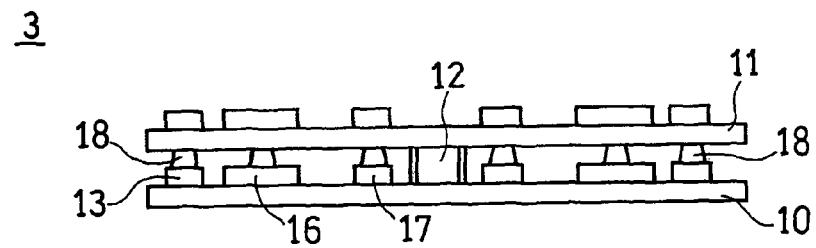
FIG. 6A is a side view schematically illustrating the structure of an electronic device according to still another embodiment of the present invention.
Figure 6B:
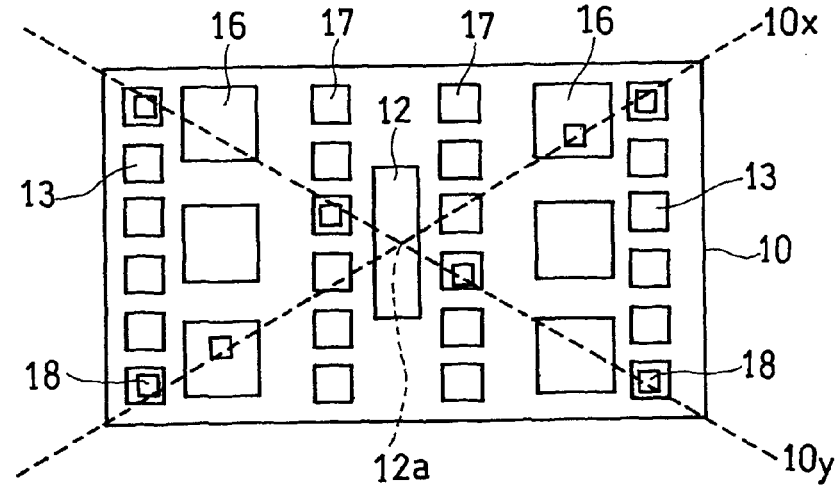
FIG. 6B is a top view of a printed wiring board shown in FIG. 6A.

FIG. 6A is a side view schematically illustrating the structure of an electronic device 3 according to the present embodiment, and FIG. 6B is a top view of a printed wiring board included therein. The electronic device 3 is similar to the electronic device 2, corresponding elements are denoted by the same reference characters, and any descriptions thereof will be omitted.

The electronic device 3 is structured in a similar manner to the electronic device 2 except for two differences. One difference is that cured resins 18 having a rectangular plane shape are used in place of the cured resins 15 having an approximately circular plane shape. The cured resins 18 are formed using thermosetting resin composition B as described earlier.

The "plane shape" as used herein refers to a shape vertically projected onto the surface of the printed wiring board 10. As with the cured resins 15, the cured resins 18 function to bond the printed wiring board 10 or the module board 11 to various electronic components, and also function to bond various electronic components together.

The other difference is that no electronic components are mounted on the surface of the module board 11 that faces the printed wiring board 10. Accordingly, the cured resins 18 are positioned between the module board 11 and the electronic components 13, 16, or 17 mounted on the printed wiring board 10. That is, a stacked structure can be formed by the printed wiring board 10 and the module board 11 without mounting electronic components on the surface of the module board 11 that faces the printed wiring board 10.

In this manner, providing the cured resins 18 having an approximately rectangular projected shape also achieves reinforcement effects similar to those achieved by the electronic device 2. To achieve the approximately rectangular projected shape of the cured resins 18, thermosetting composition B may be applied, for example, using a nozzle with a rectangular outlet in its tip. Also, the projected shape of the cured resins 18 can be rendered approximately rectangular as well by suitably selecting the viscosity of thermosetting composition B, as well as the type and content of a filler.

While the foregoing has been described with respect to the case where the connector 12 is provided, the same applies to the case where the connector 12 is not provided.

Embodiment 4

Figure 7A:
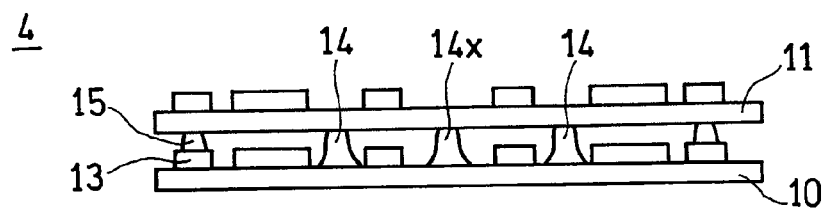
FIG. 7A is a side view schematically illustrating the structure of an electronic device according to yet another embodiment of the present invention.
Figure 7B:
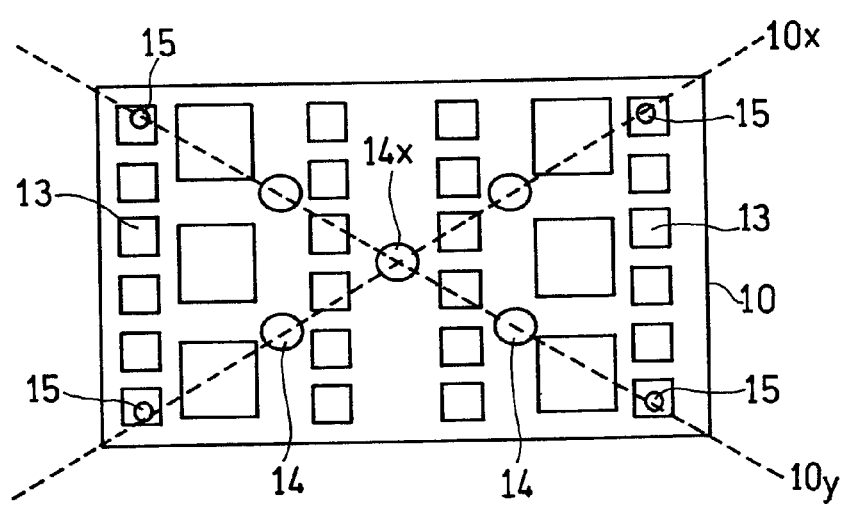
FIG. 7B is a top view of a printed wiring board shown in FIG. 7A.

FIG. 7A is a side view of an electronic device 4 according to the present embodiment, and FIG. 7B is a top view of a printed wiring board included therein. The electronic device 4 is structured in a similar manner to the electronic device 1, corresponding elements are denoted by the same reference characters, and any descriptions thereof will be omitted.

The electronic device 4 is structured in a similar manner to the electronic device 1 except that, in place of the connector 12, a cured resin 14x for directly bonding the printed wiring board 10 and the module board 11 is formed on the surface of the printed wiring board 10 in the same place where the connector 12 is mounted within the electronic device 1. This structure achieves the same level of mechanical strength and service life as in the electronic device 1.

Embodiment 5

Figure 8:
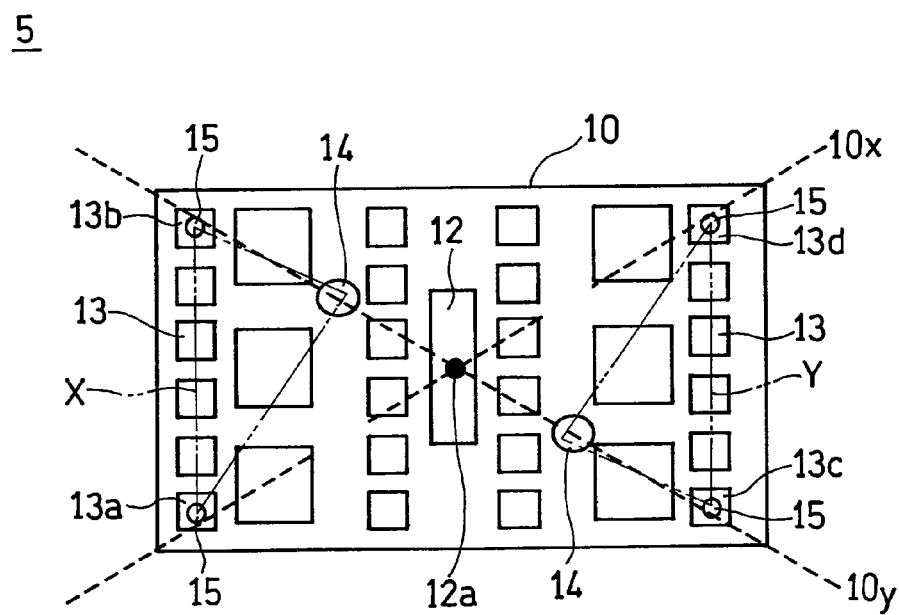
FIG. 8 is a top view schematically illustrating the structure of an electronic device according to yet another embodiment of the present invention.

FIG. 8 schematically illustrates the structure of an electronic device 5 according to the present embodiment. Here, the module board 11 is not shown for convenience of illustration.

The electronic device 5 is similar to the electronic device 1, corresponding elements are denoted by the same reference characters, and any descriptions thereof will be omitted. The electronic device 5 is structured in a similar manner to the electronic device 1 except that the number of cured resins 14 is changed from four to two. In the electronic device 5, one cured resin 14 and two cured resins 15 are provided in each of two areas opposing with respect to the connector 12 in the longitudinal direction of the printed wiring board 10.

As described above, the cured resins 14 are provided one each to both sides of the connector 12. Unlike in the electronic device 1, the cured resins 14 are formed with their centers being slightly offset from the diagonal line 10x or 10y of the printed wiring board 10. As in the electronic device 1, the cured resins 15 are formed on the electronic components 13a, 13b, 13c, and 13d mounted at four corners of the printed wiring board 10.

On one side of the connector 12 in the longitudinal direction of the printed wiring board 10, triangle X as indicated by double-dashed chain lines is formed by connecting the position of one cured resin 14 and the positions of two cured resins 15. Also, on the other side of the connector 12 in the longitudinal direction of the printed wiring board 10, triangle Y as indicated by double-dashed chain lines is formed by connecting the position of one cured resin 14 and the positions of two cured resins 15. Triangles X and Y are congruent with each other and positioned point-symmetric with respect to the center 12a of the connector 12.

By providing cured resins so as to form congruent triangular configurations positioned point-symmetric with respect to the connector 12 as described above, it becomes possible to significantly increase durability to resist torsional stress. The "torsional stress" refers to stress applied obliquely to the thickness direction of the stacked structure formed by the printed wiring board 10 and the module board 11. Typical stacked structures are susceptible to torsional deformation caused by torsional stress. While the triangles may be scalene, isosceles, or equilateral, scalene triangles are the triangles most durable to torsional stress. Scalene right triangles are particularly preferable.

Decreasing the number of cured resins from eight to six can still achieve the electronic device 5 approximately equivalent to the electronic device 1 in terms of mechanical strength and service life. Also, reducing the number of cured resins makes it possible to further simplify the production process, which is industrially advantageous. The cured resins can be positioned so as to form triangles line-symmetric with respect to an unillustrated virtual line passing through the center 12a of the connector 12 in the width direction of the printed wiring board 10. However, such a line-symmetric arrangement results in a stacked structure insufficiently durable to torsional stress. Accordingly, the stacked structure is susceptible to internal deformation or breakage caused by torsional stress. While the foregoing has been described with respect to an example where the connector 12 is provided, the same applies to the case where the connector 12 is not provided.

Embodiment 6

Figure 9A:
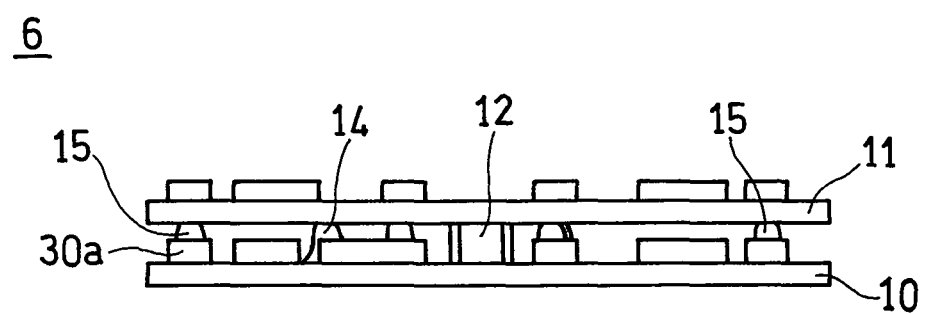
FIG. 9A is a side view schematically illustrating the structure of an electronic device according to yet another embodiment of the present invention.
Figure 9B:
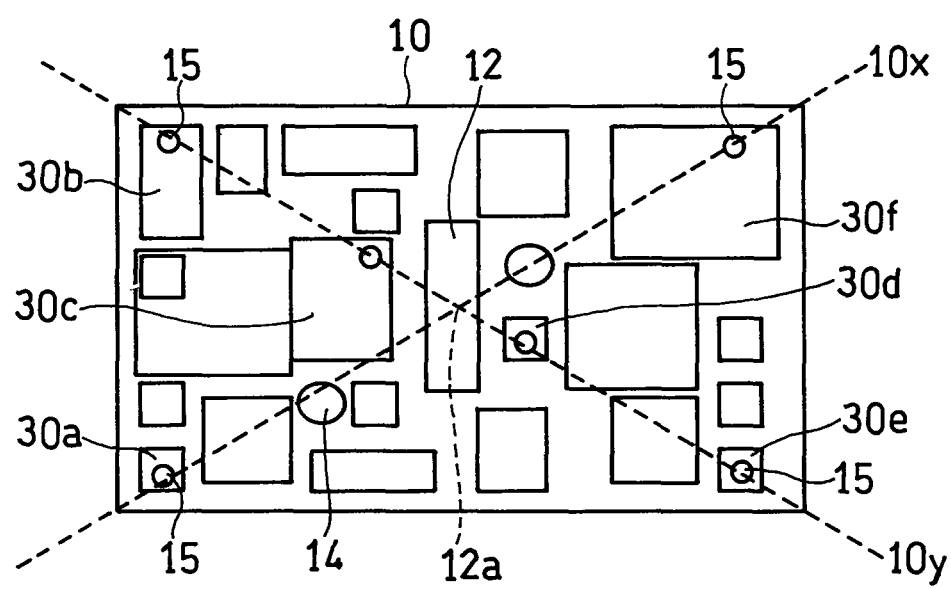
FIG. 9B is a top view of a printed wiring board shown in FIG. 9A.

FIG. 9A is a side view of an electronic device 6 according to the present embodiment, and FIG. 9B is a top view of a printed wiring board included therein. The electronic device 6 is structured in a similar manner to the electronic device 1, corresponding elements are denoted by the same reference characters, and any descriptions thereof will be omitted.

The electronic device 6 includes a printed wiring board 10, a module board 11, a connector 12, electronic components 30a, 30b, 30c, 30d, 30e, and 30f, and other electronic components. The printed wiring board 10 has various electronic components of different shapes, sizes, and functions mounted thereon in an irregular manner. Of the various electronic components, the electronic components 30a, 30b, 30e, and 30f are mounted at four corners of the printed wiring board 10. The electronic components 30c and 30d are mounted in the vicinity of the connector 12. More specifically, the electronic components 30c and 30d are mounted to different sides of the connector 12 in the longitudinal direction of the printed wiring board 10, so that each side includes either one of the components 30c and 30d. The electronic components 30a, 30b, 30c, 30d, and 30e are different in shape and size from one another.

Two cured resins 14 are formed and positioned point-symmetric with respect to the center 12a of the connector 12 on the principal surface of the printed wiring board 10. Six cured resins 15 are formed and positioned point-symmetric with respect to the center 12a of the connector 12. More specifically, the cured resins 15 are formed on the surfaces of their respective electronic components 30a, 30b, 30c, 30d, 30e, and 30f. Also, the cured resins 14 and 15 are formed on the diagonal lines 10x and 10y of the printed wiring board 10.

The cured resins 14 and 15 can be formed in any region so long as such a region is at least about 0.8 to 1.0 mm in width. Accordingly, even in the case of the printed wiring board 10 having variously sized electronic components arranged on the principal surface in an irregular manner, if there are left any regions in which no electronic component is mounted, the cured resins 14 can be formed in such regions. Also, even if the electronic components are small-sized, the cured resins 15 can be formed on their surfaces. Moreover, even if the electronic components vary in height, such variations in height can be addressed by suitably changing the amount of composition B to be applied.

Furthermore, even in the case where electronic components are mounted in positions point-symmetric with respect to the cured resins 14, the cured resins 15 can be formed on the surfaces of such electronic components. Also, the cured resins 15 can be formed on the surfaces of the electronic components even if there is no space for forming the cured resins 14. Accordingly, a stacked structure can be formed by the printed wiring board 10 and the module board 11 without changing the design of the printed wiring board 10. Moreover, the electronic device 6 including such a stacked structure has a high mechanical strength and a superior durability, and therefore long-term reliability thereof is high. While the foregoing has been described with respect to an example where the connector 12 is provided, the same applies to the case where the connector 12 is not provided.

The foregoing has been described with respect to specific embodiments. However, various modifications can be made. For example, Embodiment 1 may include cured resins for bonding electronic components on the printed wiring board to electronic components on the module board as in Embodiment 2. Alternatively, Embodiment 2 may include cured resins for directly bonding the printed wiring board and the module board or cured resins for bonding electronic components on the printed wiring board to the module board.

It is understood that the package structure of the present invention can be used for large-capacity storage units in portable electronic devices as will be described later, and can be preferably used for devices for controlling various electronic devices. A preferred but non-limiting example of the electronic device is a portable electronic device. Examples of the portable electronic device include a cell phone, a notebook computer, a personal digital assistant, a digital still camera, and a portable game apparatus.

Also, the portable electronic device of the present invention is characterized by including the package structure according to the present invention. That is, the portable electronic device of the present invention can be structured in a similar manner to conventional portable electronic devices except that the portable electronic device of the present invention has incorporated therein a storage device formed by the package structure of the present invention. The incorporation of the package structure according to the present invention renders the portable electronic device highly durable to external load and impact. For example, even when the portable electronic device is intentionally or unintentionally loaded or subjected to impact due to falling or collision, stress is dispersed in a generally uniform manner across the package structure, and therefore the portable electronic device is resistant to breakdown, failure, and so on. Thus, the package structure is particularly suitable for portable use.

Specific examples of the portable electronic device according to the present invention include those equipped with compact large-capacity solid-state memory, such as a memory card, flash memory, USB memory, volatile memory, cache memory, semiconductor memory, or IC memory.

Described next are cured resin evaluation methods and results.

[Cured Resins Evaluations]

(1) Cured Resin for Directly Bonding Printed Wiring Boards

Figure 10A:
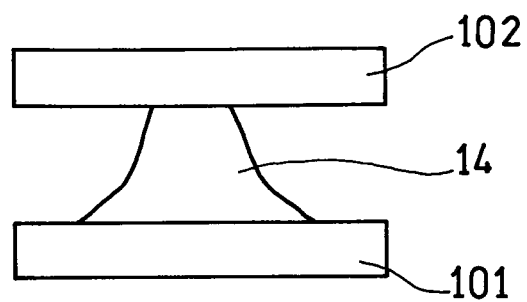
FIGS. 10A, 10B, and 10C are side views describing a method for evaluating cured resins for mechanically connecting printed wiring boards of an electronic device according to the present invention.

The cured resin is intended to mechanically bond printed wiring boards as shown in FIG. 10A.

A resin composition used for evaluating the cured resin contained a base resin, a carmine paste acting as a coloring agent, and talc acting as a filler. The base resin was made by 100 parts by weight of liquid epoxy resin (bisphenol A/F resin blend produced by Ajinomoto Fine-Techno Co., Inc. under the trade name "XBM1000") having added thereto 10 parts by weight of amine-based curing agent (produced by Ajinomoto Fine-Techno Co., Inc. under the trade name "AJI-CURE") and 1 part by weight of imidazole-based curing accelerator (produced by Shikoku Chemicals Corp. under the trade name "CUREZOL"). The resin had a viscosity of 80 Pa·s and a thixotropic index of 7.5 at a temperature of 25° C. The curing temperature was 90° C.

As an evaluation sample, a resin composition was produced by adding 30, 35, 40, 42.5, and 45 parts by weight of talc to 100 parts by weight of base resin mixed with 1 part by weight of carmine paste.

The resin composition was applied to the top surface of a first printed wiring board 101, and a second printed wiring board 102 was placed in parallel to the first printed wiring board 101 such that the bottom surface thereof was in contact with the applied resin composition, as shown in FIG. 10A. While maintaining a constant gap between the boards 101 and 102, the resin composition was thermally cured, thereby connecting the boards 101 and 102 via a cured resin 14 to produce a sample.

The printed wiring boards 101 and 102 were glass epoxy boards of 10 mm in length, 10 mm in width, and 0.5 mm in thickness with the resin composition applied in an amount from 0.4 to 0.5 mg and a 1-mm gap between the boards.

The produced samples were examined for the relationship between the connection of the boards 101 and 102 by the cured resin 14 and the concentration of the filler. The connection was evaluated by the following drop test. Specifically, each sample was dropped from predetermined heights to obtain a height (failure height) at which an operational abnormality of the semiconductor device was detected. The drop height was initially set at 50 cm and then raised in increments of 10 cm. The samples were graded as follows: "A" (pass, high impact resistance) for failure heights of more than 150 cm; "B" (tentative pass, still improvable) for failure heights in the range from more than 100 cm to 150 cm; "C" (practically usable level, still improvable) for failure heights in the range from more than 90 cm to 100 cm; and "D" (fail) for failure heights of less than 90 cm. The results are shown in Table 1. In the evaluation results, "A" represents the boards being most firmly connected, "B" represents the boards sufficiently connected for practical use, and "D" represents the boards found unreliable for practical use.

TABLE 1

| | Sample No. | | | | |
|---|---|---|---|---|---|
| | 1 | 2 | 3 | 4 | 5 |
| Proportion of Filler (parts by weight) | 30 | 35 | 40 | 42.5 | 45 |
| Evaluation Result | D | B | A | B | D |

Figure 10B:
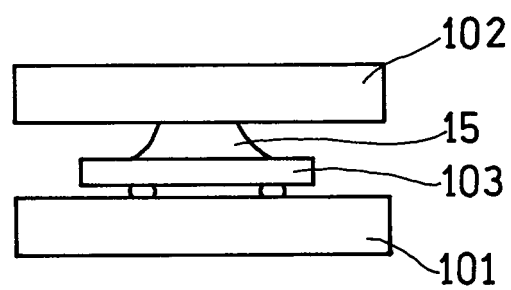

(2) Cured Resin for Bonding the Top Surface of Electronic Component and the Bottom Surface of the Printed Wiring Board The cured resin is intended to connect an electronic component 103 mounted on the first printed wiring board 101 to the second printed wiring board 102, as shown in FIG. 10B.

A resin composition used for evaluating the cured resin contained a base resin, a carmine paste acting as a coloring agent, and talc acting as a filler. Ingredients and compositional proportions for the base resin and the coloring agent were the same as those used for the cured resin in (1) above.

As an evaluation sample, a resin composition was produced by adding 25, 30, 35, 40, and 45 parts by weight of talc to 100 parts by weight of base resin mixed with 1 part by weight of carmine paste.

The resin composition was applied to the top surface of the electronic component 103 mounted on the first printed wiring board 101, and the second printed wiring board 102 was placed in contact with the applied resin composition, as shown in FIG. 10B. While maintaining a constant gap between the boards 101 and 102, the resin composition was thermally cured, thereby connecting the boards 101 and 102 via a cured resin 15 to produce a sample.

The same glass epoxy boards as above were used as the printed wiring boards 101 and 102, and a flat-type semiconductor element with a 5-square-mm top surface and a 0.3 mm thickness was used as the electronic component 103. The resin composition was applied in an amount from 0.4 to 0.5 mg and the gap between the boards 101 and 102 was 1 mm. The produced samples were examined by the same drop test as described above for the relationship between the connection of the electronic component 103 on the board 101 to the board 102 by the cured resin 15 and the concentration of the filler. The results are shown in Table 2.

TABLE 2

| | Sample No. | | | | |
|---|---|---|---|---|---|
| | 11 | 12 | 13 | 14 | 15 |
| Proportion of Filler (parts by weight) | 25 | 30 | 35 | 40 | 45 |
| Evaluation Result | D | B | A | B | D |

(3) Cured Resin for Bonding the Top Surfaces of Electronic Components

Figure 10C:
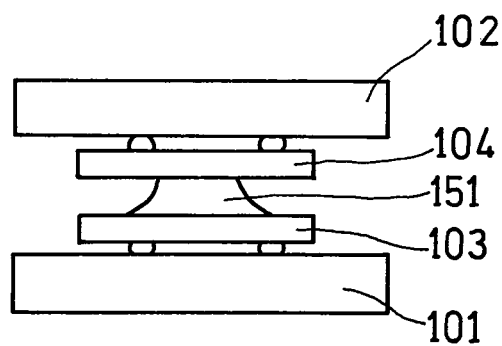

The cured resin is intended to connect electronic components 103 and 104 mounted on two printed wiring boards 101 and 102, respectively, thereby substantially connecting the printed wiring boards, as shown in FIG. 10C.

A resin composition used here contained the same ingredients as above, i.e., a base resin, a carmine paste acting as a coloring agent, and talc acting as a filler, but the filler was mixed at varying ratios. Specifically, a resin composition was produced by adding 20, 25, 30, 35, and 40 parts by weight of talc to 100 parts by weight of base resin mixed with 1 part by weight of carmine paste.

First and second printed wiring boards 101 and 102 were prepared with electronic components 103 and 104 being mounted on the boards 101 and 102, respectively, and the resin composition was applied to the electronic components 103 in a predetermined amount. Then, the printed wiring board 102 was placed in parallel to the printed wiring board 101 with the electronic component 104 facing the electronic component 103 such that the resin composition was disposed between the electronic components 103 and 104, resulting in sufficient contact areas between the electronic component 104 and the resin composition on the electronic component 103, as shown in FIG. 10C. While maintaining a constant gap between the boards 101 and 102, the resin composition was thermally cured, thereby connecting the mounted electronic components 103 and 104 via a cured resin 151 to produce a sample.

The same glass epoxy boards as above were used as the printed wiring boards 101 and 102, and flat-type semiconductor elements with a 5-square-mm top surface and a 0.3 mm thickness were used as the electronic components 103 and 104. The resin composition was applied in an amount from 0.4 to 0.5 mg and the gap between the boards 101 and 102 was 1 mm.

The produced samples were examined by the same drop test as described above for the relationship between the connection of the boards 101 and 102 by the cured resin 151 via the electronic components 103 and 104 and the concentration of the filler. The results are shown in Table 3.

TABLE 3

| | Sample No. | | | | |
|---|---|---|---|---|---|
| | 21 | 22 | 23 | 24 | 25 |
| Proportion of Filler (parts by weight) | 20 | 25 | 30 | 35 | 40 |
| Evaluation Result | D | B | A | B | D |

As is apparent from Tables 1, 2, and 3, when the amounts of filler to be blended with 100 parts by weight of base resin for the cured resins 14, 15, and 151 are respectively 35 to 42.5, 30 to 40, and 25 to 35 parts by weight, the printed wiring boards can be substantially connected to each other. In particular, for samples with evaluation result "A", the connection was found to be firm as described above.

When resin compositions made up of similar ingredients are used, it is preferable that the filler concentration thereof be suitably selected depending on the case where i) a plurality of printed wiring boards are connected together, ii) a plurality of printed wiring boards are substantially connected by connecting one printed wiring board to electronic components mounted on the other printed wiring board, or iii) a plurality of printed wiring boards are substantially connected by connecting electronic components mounted on the printed wiring boards.

Increasing the ratio of filler to be blended increases the viscosity of the resin composition so that applied resin can be prevented from being excessively spread. As a result, a desired application height can be secured. On the other hand, when the resin composition is applied to electronic components as shown in FIGS. 10B and 10C, increasing the ratio of filler to be blended causes the applied resin composition to be excessively resistant to spreading. Accordingly, when the printed wiring boards are pressed so as to form a predetermined gap therebetween, electronic components might be heavily loaded via the applied resin composition, which adversely affects the reliability of an electronic device employing the printed wiring boards, and therefore it is desirable to suitably select the blending ratio of the filler in accordance with where the resin composition is applied.

That is, for the cured resins 14 for connecting printed wiring boards, it is preferable to use a resin composition with a higher filler concentration compared to the cured resins 15 for connecting one printed wiring board to electronic components mounted on the other printed wiring board. Also, for the cured resins 15, it is preferable to use a resin composition with a higher filler concentration compared to the cured resins 151 for connecting electronic components mounted on one printed wiring board to those mounted on the other printed wiring board.

Although the present invention has been described in terms of the presently preferred embodiments, it is to be understood that such disclosure is not to be interpreted as limiting. Various alterations and modifications will no doubt become apparent to those skilled in the art to which the present invention pertains, after having read the above disclosure. Accordingly, it is intended that the appended claims be interpreted as covering all alterations and modifications as fall within the true spirit and scope of the invention.

The invention claimed is:

1. A package structure comprising:
a first printed wiring board having a top surface on which a plurality of electronic components including at least one first electronic component are mounted;
a second printed wiring board stacked over the top surface of the first printed wiring board; and
a plurality of connecting members for mechanically connecting the first and second printed wiring boards while maintaining a constant gap therebetween, wherein:
the connecting members include a plurality of first cured resins bonding a top surface of the at least one first electronic component to a bottom surface of the second printed wiring board, and a plurality of second cured resins directly bonding the top surface of the first printed wiring board to the bottom surface of the second printed wiring board,
the plurality of first cured resins and the plurality of second cured resins have a truncated cone shape,
a base area of the plurality of second cured resins is larger than a base area of the plurality of first cured resins,
a number of the plurality of first cured resins is at least four, a number of the plurality of second cured resins is at least four, and
the plurality of first cured resins and the plurality of second cured resins are positioned line-symmetric.

2. The package structure according to claim 1, wherein:
the electronic components include at least one second electronic component,
the second printed wiring board has at least one third electronic component mounted thereon at a position corresponding to the at least one second electronic component, and
the connecting members include a third cured resin for bonding a top surface of the at least one second electronic component to a top surface of the at least one third electronic component.

3. The package structure according to claim 1, further comprising a connector provided at an approximate center of the first printed wiring board for mechanically and electrically connecting the first and second printed wiring boards, wherein the plurality of first cured resins and the plurality of second cured resins are positioned line-symmetric about the connector.

4. The package structure according to claim 1, wherein the plurality of second cured resins have a larger filler content than the plurality of first cured resins.

5. The package structure according to claim 2, wherein the plurality of second cured resins have a larger filler content than the plurality of first cured resins, and the plurality of first cured resins have a larger filler content than the third cured resin.

6. The package structure according to claim 1, wherein the first and second printed wiring boards differ in glass-transition temperature from the plurality of first and second cured resins by 15° C. or less.

7. The package structure according to claim 2, wherein the first and second printed wiring boards differ in glass-transition temperature from the plurality of first and second resins and the third cured resin by 15° C. or less.

8. The package structure according to claim 1, wherein the first and second printed wiring boards differ in linear expansion coefficient from the plurality of first and second cured resins by $1.0 \times 10^{-5}$ or less.

9. The package structure according to claim 2, wherein the first and second printed wiring boards differ in linear expansion coefficient from the plurality of first and second cured resins and the third cured resin by $1.0 \times 10^{-5}$ or less.

10. The package structure according to claim 1, wherein the plurality of first and second cured resins have a curing temperature of 85 to 100° C.

11. The package structure according to claim 2, wherein the plurality of first and second cured resins and the third cured resin have a curing temperature of 85 to 100° C.

12. The package structure according to claim 1, wherein the first electronic component is a semiconductor element in flat package format.

13. The package structure according to claim 2, wherein the first, second, or third electronic component is a semiconductor element in flat package format.

14. A portable storage device including a package structure of claim 1.

15. The package structure according to claim 1, wherein the plurality of first cured resins are mounted at four corners of the first printed wiring board.

16. The package structure according to claim 1, wherein a plurality of triangles are formed by corresponding positions of two first cured resins and one second cured resin, and at least two of the plurality of triangles are positioned point-symmetric with respect to at least one of centers of the first printed wiring board and the second printed wiring board.

17. The package structure according to claim 1, wherein the plurality of second cured resins are positioned closer to a center of the first printed wiring board than the plurality of first cured resins.

* * * * *